United States Patent
Biber et al.

(10) Patent No.: US 10,261,147 B2
(45) Date of Patent: Apr. 16, 2019

(54) MAGNETIC RESONANCE DEVICE WITH A SWITCHING MATRIX UNIT AND A METHOD FOR PULSE SEQUENCE OPTIMIZATION

(71) Applicants: Stephan Biber, Erlangen (DE); David Grodzki, Erlangen (DE)

(72) Inventors: Stephan Biber, Erlangen (DE); David Grodzki, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 433 days.

(21) Appl. No.: 15/043,620

(22) Filed: Feb. 14, 2016

(65) Prior Publication Data

US 2016/0238681 A1   Aug. 18, 2016

(30) Foreign Application Priority Data

Feb. 13, 2015  (DE) .................. 10 2015 202 670

(51) Int. Cl.
   *G01R 33/385*  (2006.01)
   *G01R 33/54*   (2006.01)

(52) U.S. Cl.
   CPC ........ *G01R 33/3852* (2013.01); *G01R 33/543* (2013.01)

(58) Field of Classification Search
   CPC .................... G01R 33/3852; G01R 33/543
   See application file for complete search history.

(56) References Cited

U.S. PATENT DOCUMENTS

| | | | |
|---|---|---|---|
| 5,066,914 A | 11/1991 | Vavrek et al. | |
| 5,270,657 A * | 12/1993 | Wirth ................. | G01R 33/3852 324/318 |
| 6,025,720 A | 2/2000 | Lenz et al. | |
| 6,323,649 B1 | 11/2001 | Pace et al. | |
| 6,448,775 B1 | 9/2002 | Lenz | |
| 6,900,638 B1 * | 5/2005 | Yair .................... | G01R 33/3852 324/309 |
| 9,880,248 B2 * | 1/2018 | Park ................... | G01R 33/5612 |
| 2006/0152222 A1 | 7/2006 | Trabbic et al. | |

(Continued)

FOREIGN PATENT DOCUMENTS

| | | |
|---|---|---|
| CN | 1745315 A | 3/2006 |
| CN | 1883111 A | 12/2006 |

(Continued)

OTHER PUBLICATIONS

German Office Action for German Application No. 10 2015 202 670.1, dated Jan. 21, 2016, with English Translation.

(Continued)

*Primary Examiner* — Rodney A Bonnette
(74) *Attorney, Agent, or Firm* — Lempia Summerfield Katz LLC (57) ABSTRACT

A magnetic resonance device includes at least one gradient amplifier and at least one gradient coil. The magnetic resonance device also includes a switching matrix unit that is embodied flexibly to connect the at least one gradient amplifier to the at least one gradient coil. A preliminary pulse sequence for the magnetic resonance device provides that in the optimized pulse sequence, a sufficient number of gradient amplifiers is available at any point for operating the gradient coils used.

16 Claims, 9 Drawing Sheets

(56) References Cited

U.S. PATENT DOCUMENTS

2007/0075773 A1 4/2007 Lenz
2010/0315084 A1 12/2010 Sacolick et al.

FOREIGN PATENT DOCUMENTS

| CN | 101919696 A | 12/2010 |
|----|-------------|---------|
| DE | 60030928 T2 | 9/2007 |
| EP | 1085339 B1 | 3/2001 |
| JP | 2001095783 A | 4/2001 |
| JP | 2001245870 A | 9/2001 |
| JP | 2010284525 A | 12/2010 |

OTHER PUBLICATIONS

Korean Office Action for related Korean Application No. 10-2016-0015856 dated May 15, 2017, with English Translation.
Korean Notice of Allowance for related Korean Application No. 10-2016-0015856 dated Oct. 10, 2017.
Chinese Office Action for Chinese Patent Application No. 201610059870.5, dated Mar. 23, 2018, with English Translation.

\* cited by examiner

| | $C_{1,a}$ | $C_{1,b}$ | $C_{2,a}$ | $C_{2,b}$ | $C_{3,a}$ | $C_{3,b}$ | $A_{1,a}$ | $A_{1,b}$ | $A_{2,a}$ | $A_{2,b}$ | $A_{3,a}$ | $A_{3,b}$ |
|---|---|---|---|---|---|---|---|---|---|---|---|---|
| $C_{1,a}$ | | 0 | 0 | 0 | 0 | 0 | 1 | 0 | 1 | 0 | 0 | 0 |
| $C_{1,b}$ | | | 0 | 0 | 0 | 0 | 0 | 1 | 0 | 1 | 0 | 0 |
| $C_{2,a}$ | | | | 0 | 0 | 0 | 0 | 0 | 0 | 0 | 0 | 0 |
| $C_{2,b}$ | | | | | 0 | 0 | 0 | 0 | 0 | 0 | 0 | 0 |
| $C_{3,a}$ | | | | | | 0 | 0 | 0 | 0 | 0 | 1 | 0 |
| $C_{3,b}$ | | | | | | | 0 | 0 | 0 | 0 | 0 | 1 |
| $A_{1,a}$ | | | | | | | | 0 | 0 | 0 | 0 | 0 |
| $A_{1,b}$ | | | | | | | | | 0 | 0 | 0 | 0 |
| $A_{2,a}$ | | | | | | | | | | 0 | 0 | 0 |
| $A_{2,b}$ | | | | | | | | | | | 0 | 0 |
| $A_{3,a}$ | | | | | | | | | | | | 0 |
| $A_{3,b}$ | | | | | | | | | | | | |

FIG 4

|        | $C_{1,a}$ | $C_{1,b}$ | $C_{2,a}$ | $C_{2,b}$ | $C_{3,a}$ | $C_{3,b}$ | $A_{1,a}$ | $A_{1,b}$ | $A_{2,a}$ | $A_{2,b}$ | $A_{3,a}$ | $A_{3,b}$ |
|---|---|---|---|---|---|---|---|---|---|---|---|---|
| $C_{1,a}$ |  | 0 | 0 | 0 | 0 | 0 | 0 | 0 | 0 | 0 | 0 | 0 |
| $C_{1,b}$ |  |  | 0 | 0 | 0 | 0 | 0 | 0 | 0 | 0 | 0 | 0 |
| $C_{2,a}$ |  |  |  | 0 | 0 | 0 | 0 | 1 | 0 | 0 | 0 | 0 |
| $C_{2,b}$ |  |  |  |  | 0 | 0 | 0 | 0 | 0 | 0 | 0 | 1 |
| $C_{3,a}$ |  |  |  |  |  | 0 | 0 | 0 | 0 | 0 | 0 | 0 |
| $C_{3,b}$ |  |  |  |  |  |  | 0 | 0 | 0 | 0 | 0 | 0 |
| $A_{1,a}$ |  |  |  |  |  |  |  | 0 | 0 | 0 | 0 | 0 |
| $A_{1,b}$ |  |  |  |  |  |  |  |  | 0 | 0 | 0 | 0 |
| $A_{2,a}$ |  |  |  |  |  |  |  |  |  | 0 | 0 | 0 |
| $A_{2,b}$ |  |  |  |  |  |  |  |  |  |  | 1 | 0 |
| $A_{3,a}$ |  |  |  |  |  |  |  |  |  |  |  | 0 |
| $A_{3,b}$ |  |  |  |  |  |  |  |  |  |  |  |  |

MAGNETIC RESONANCE DEVICE WITH A SWITCHING MATRIX UNIT AND A METHOD FOR PULSE SEQUENCE OPTIMIZATION

This application claims the benefit of DE 10 2015 202 670.1, filed on Feb. 13, 2015, which is hereby incorporated by reference in its entirety.

BACKGROUND

The present embodiments relate to a magnetic resonance device with a switching matrix unit, a method for optimization of a preliminary pulse sequence, and a computer program product.

Magnetic resonance tomography (MRT) is a known technique for creating images of the inside of the body of an examination object. A basic magnetic field is overlaid in a magnetic resonance device with rapidly switched gradient fields, which are created by a gradient system of the magnetic resonance device. Radio-frequency excitation pulses are irradiated into the examination object by a radio-frequency antenna unit of the magnetic resonance device to trigger magnetic resonance signals are shortened, and the triggered magnetic resonance signals are recorded, based on which magnetic resonance images are created. In such cases, the recorded magnetic resonance signals are demodulated phase-sensitively and converted by sampling and by analog-digital conversion into complex-number values, which are stored in a k-space matrix, from which a magnetic resonance image is able to be reconstructed by a multi-dimensional Fourier transformation.

One of the uses of the aforesaid gradient fields in such cases is for local encoding. This provides that the gradient fields have the task of making the contributions of individual voxels of a region of the examination object to be imaged distinguishable. In such cases, the gradient fields are used in connection with the radio-frequency signals for selective excitation of a predeterminable region of the examination object (e.g., a slice, and/or for spatial encoding within an excited region; a slice or a larger volume).

The gradient system of currently usual magnetic resonance devices includes three gradient coils, each for one spatial direction, which each create a spatially linear gradient field. In accordance with more recent ideas from research, non-linear gradient fields are also used (e.g., by using three non-linear gradient fields or by overlaying three linear gradient fields with further non-linear gradient fields). The result of this may be that there is a need for additional gradient coils (e.g., for creating the non-linear gradient fields as well as the currently usual three gradient coils).

Nowadays the gradient coils are typically each connected to a gradient amplifier, which also often have equal power. Thus N gradient coil amplifiers are needed for N gradient coils, regardless of whether the system involved is a conventional system with three or possibly a research system with more than three gradient coils.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a magnetic resonance device and a method for improving the functionality of a gradient system are provided.

A magnetic resonance device includes at least one gradient amplifier and at least one gradient coil. Each of the at least one gradient amplifier and the at least one gradient coil includes at least one terminal. The magnetic resonance device includes a switching matrix unit that is embodied to change at least one connection state of the at least one terminal of the at least one gradient amplifier and of the at least one terminal of the at least one gradient coil.

One task of the at least one gradient amplifier may be to create electrical current pulses according to an order programmed in a pulse sequence with precise amplitudes and precise timing. The current pulses may be transmitted in each case via the at least one terminal that the at least one gradient amplifier and the at least one gradient coil each have, from the at least one gradient amplifier to the at least one gradient coil, so that the at least one gradient coil may create at least one gradient field.

This at least one gradient field may be spatially linear or non-linear. A spatially linear gradient field provides that the magnetic field strength H and/or the magnetic flux density B increases or decreases in parallel to any given spatial direction proportional with a path parallel to the spatial direction.

Often, at least one gradient coil is embodied so that the magnetic field caused by the at least one gradient coil is oriented in a direction plotted relative to the magnetic resonance device, identified by an axis. Thus, a magnetic resonance device may have three plotted axes. A z-axis may be defined by a central axis of a possible cylindrical patient receiving area. Perpendicular thereto, an x-axis may be defined in a horizontal direction, and a y-axis may be defined in a vertical direction. However, other definitions may be provided. A magnetic resonance device includes a gradient coil for each of these three axes in each case, which may create a gradient field in each case. By overlaying at least two gradient fields, resulting gradient fields that are oriented in any given spatial direction deviating from the three plotted axes may be created.

In such cases, a number (e.g., all) of the at least one gradient coils may be manufactured in a single physical unit (e.g., the gradient coils may be built into and/or implemented in the same component and/or the same components). Each gradient coil may also be manufactured in a self-contained physical unit. A number (e.g., all) of the at least one gradient amplifiers may be built into a single physical unit, such as a housing. Each gradient amplifier may also be manufactured in a self-contained physical unit.

The switching matrix unit may represent a switching matrix that may be disposed between the at least one gradient amplifier and the at least one gradient coil and may distribute electrical power and/or an electrical current and/or an electrical voltage of the at least one gradient amplifier flexibly to the at least one gradient coil. This connection may be made by the at least one connection state of the at least one terminal of the at least one gradient amplifier and the at least one terminal of the at least one gradient coil being suitably established by the switching matrix unit.

Possible connection states are, for example, a connected state, so that a flow of current between two terminals is made possible, or a non-connected state between two terminals, so that a flow of current between two terminals is prevented. A terminal may be an electrical contact point that may be connected by a current conductor (e.g., a cable).

Current and/or voltage may be transferred, for example, via such an electrical contact point. The change to the at least one connection state (e.g., switching state) may be made, for example, by using one or more multiple-throw switches (e.g., SP2T (single-pole, two-throw) switches and/or SP3T (single-pole, three-throw) switches).

The switching matrix unit enables the power and/or current and/or voltage of the at least one gradient amplifier to be distributed flexibly to the at least one gradient coil.

For example, one switching matrix unit, which may include a switching logic, may allow a series circuit of the at least one gradient coil between the at least one gradient amplifier and the at least one gradient coil, so that, for example, three gradient coils may be supplied by just one or two gradient amplifiers.

The number of gradient amplifiers may be equal to the number of gradient coils, which may be the case in conventional magnetic resonance devices, or not equal to the number of gradient coils. In one embodiment, the number of gradient amplifiers may be smaller than the number of gradient coils. By suitable adaptation of the at least one connection state by the switching matrix unit, it may be made possible that, at any given time during a pulse sequence designed therefor, a sufficient number of gradient amplifiers is available for operation of the at least one gradient coil (e.g., that there are never more gradient amplifiers needed than are necessary for supply of the at least one gradient coil).

For example, the number of gradient amplifiers may be reduced compared to the currently usual number, so that the number of gradient amplifiers is smaller than three (e.g., in order to reduce manufacturing costs). For example, a magnetic resonance device including three gradient coils and only one gradient amplifier may be provided. Thus, a gradient field may still be generated in each case in at least three different spatial directions (e.g., orthogonal to one another) with a minimum number of amplifiers.

The number of gradient amplifiers may be greater than three. This may be provided when additional gradient coils are used, as primarily for research purposes at present.

At least one gradient coil may be embodied to create a spatially non-linear gradient field. This is of advantage in the area of research at present. For example, three conventional gradient coils may be combined to create linear gradient fields with further gradient coils to create non-linear gradient fields. Other variants may also be provided. The magnetic resonance device enables the expense of additional gradient amplifiers, which would otherwise be required for operating the further gradient coils, to be restricted.

In a development, at least two gradient amplifiers have at least one different characteristic. By using the switching matrix unit, the one or the number of gradient amplifiers of which the characteristic is suitable for creating the gradient field desired at this point may be used at any point in the pulse sequence. For example, the at least one different characteristic may be a different maximum power and/or a different maximum voltage and/or a different maximum current strength.

With usual magnetic resonance devices of the prior art, which have a gradient amplifier in each case for each gradient coil present, the maximum power and/or maximum voltage and/or maximum current of an individual gradient amplifier may be simultaneously distributed to all gradient coils, which are usually assigned to one axis in each case. This leads to high manufacturing costs since each gradient amplifier is to have the same maximum power and/or maximum voltage and/or maximum current, although most usual pulse sequences never need these maximum values on all axes simultaneously. By contrast, lower-cost gradient amplifiers may be used in the magnetic resonance device.

In addition, a gradient amplifier that drives gradient coils connected in series may, for example, be configured for a higher maximum voltage than the gradient amplifier that does not drive any gradient coils connected in series. This would enable the rise time of the series circuit of the two gradient coils to be reduced.

A method is further provided for optimizing a preliminary pulse sequence for the magnetic resonance device. In this method, the pulse sequence is optimized so that, at each point of the pulse sequence, there is a sufficient number of gradient amplifiers available for the operation of the gradient coils used (e.g., so that, at any point in the pulse sequence, the number of gradient coils used is less than or equal to the number of gradient amplifiers that is available and/or is included in the magnetic resonance device).

The pulse sequence may represent a temporal sequence of excitation pulses and gradient pulses for triggering magnetic resonance signals and for local encoding. The excitation pulses may be created by a radio-frequency antenna unit and irradiated into an examination object. A waveform and/or a shape of a gradient pulse (e.g., also referred to as gradient object or gradient) may be described in an idealized manner by a rise time, within which an amplitude of the gradient field is built up with a slew rate, a duration, during which the amplitude of the gradient field is kept constant, and a decay time, within which the amplitude of the gradient field decays. However, other forms of gradient may also be provided.

The preliminary pulse sequence may, for example, be a pulse sequence that is able to be employed as part of examinations using conventional magnetic resonance devices, which have one gradient amplifier for each gradient coil. Such a preliminary pulse sequence may be optimized (e.g., to the extent that at each point in the pulse sequence a maximum of as many gradient amplifiers may be activated simultaneously as there are gradient amplifiers available). This enables it to be provided that the resulting pulse sequence may be executed by the magnetic resonance device.

One form of embodiment of the method makes provision for a difference between a k-space encoding of the optimized pulse sequence and a k-space encoding of the preliminary pulse sequence to be minimized. The k-space may be encoded by an application of one or more gradient pulses. A gradient pulse may, for example, be employed for a slice selection and/or a frequency encoding and/or a phase encoding. The preliminary pulse sequence may be optimized such that the k-space encoding is not changed by the optimization. The result thus achieved is that the optimized pulse sequence, compared to the preliminary pulse sequence, delivers the same or practically the same local information (e.g., local resolution) of the magnetic resonance signals.

In one embodiment, a difference between at least one contrast of the optimized pulse sequence and at least one contrast of the preliminary pulse sequence is minimized by the method. A contrast may be understood, within the framework of magnetic resonance tomography, as a relative difference in signal values between neighboring tissue types. For example, a distinction is made between a $T_1$ contrast, a $T_2$ contrast, a $T_2$ contrast and a proton density contrast. The setting of the contrast and/or a contrast weighting are influenced by a timing of the pulse sequence. For example, the contrast weighting is dependent on a repeat time TR and an echo time TE. Therefore, TR and TE are advantageously changed by the optimization to the smallest possible extent (e.g., not at all). The result able to be achieved by this is that the optimized pulse sequence delivers the same or practically the same contrasts by comparison with the preliminary pulse sequence.

One form of embodiment makes provision for a duration of the pulse sequence to be minimized. The period of the pulse sequence determines a measurement time of the magnetic resonance measurement. Short measurement times and thus a high productivity improve the economy of the magnetic resonance device. Depending on the sequence type, the period of the pulse sequence may be determined by multiplying the repeat time TR by a number of phase encoding steps.

In a variant of the method, at least one gradient pulse of the preliminary pulse sequence is offset in time within the pulse sequence. A temporal redistribution and/or displacement of the gradient pulses may be carried out without changing the k-space encoding and/or the timing (e.g., the repeat time TR and/or the echo time and/or an echo spacing and/or the contrast).

If the preliminary pulse sequence is embodied such that, at a time $t_0$, more gradient coils are activated (e.g., are supplied with current and/or with voltage and/or with power) than there are gradient amplifiers available, then possibly at least one gradient pulse within the pulse sequence may be shifted in time such that after this shift, there is a sufficient number of gradient amplifiers present at all times for operating the gradient coils or that the maximum number of gradient amplifiers used at the same time is not exceeded. For example, the shift may be made by an explicit search being conducted after at least one time interval I in the preliminary pulse sequence within which fewer gradient coils are activated than at time $t_0$. Only as many gradient coils are activated within this time interval I, after any shifting of the at least one gradient pulse, for there to be a sufficient number of gradient amplifiers present at all times for operating the gradient coils.

If, for example, two gradient amplifiers are available and if, in accordance with the present pulse sequence, three gradient coils are activated at point in time $t_0$, then it may be advantageous to search after a time interval T, which includes a maximum of one gradient pulse. This is because, after a shift of a gradient pulse from $t_0$ into the time interval I, two gradient pulses are present in this time interval I, so that with two gradient amplifiers, a sufficient number of gradient amplifiers for simultaneous generation of the two gradient pulses is provided.

In one embodiment, a number of gradient pulses are also be shifted in time in relation to one another in order to fulfill the above-mentioned condition, in accordance with which a sufficient number of gradient amplifiers for operating the gradient coils is available at all times. Accordingly, a search will then be made after a number of suitable time intervals $I_1, I_2 \ldots$.

The pulse sequence may include a number of corresponding periods, which follow one another in time and of which the respective k-space encoding differs from one corresponding period to another corresponding period such that the desired k-space is sampled entirely or partly by the totality of the corresponding periods. Depending on the type of pulse sequence, such as, for example, spin echo (SE), gradient echo (GE), turbo spin echo (TSE), inversion recovery (IR), echo planar imaging (EPI) etc., the corresponding period may be determined by different events, such as, for example, consecutive excitation pulses. The shift is carried out within the same corresponding period (e.g., the at least one time interval I and $t_0$ are located within the same corresponding period). In one embodiment, the result able to be achieved by this is that the resulting k-space encoding remains unchanged.

In a further embodiment of the method, a duration of at least one gradient pulse is optimized (e.g., shortened). This enables any times to be avoided at which more gradient coils are activated than there are gradient amplifiers available.

By shortening the at least one gradient pulse, a rearrangement of the gradient pulses of the preliminary pulse sequence may also be facilitated in order to create a pulse sequence optimized by the rearrangement, in which at any given point in time, a sufficient number of gradient amplifiers is available for the operation of the gradient coils used. If, for example, the timing (e.g., the repeat time TR and/or the echo time TE and/or the echo spacing) is left unchanged, so that in these ways no possible additional periods are created within the pulse sequence, it is possible that only the shortened at least one gradient pulse fits into the at least one time interval I, since the duration of the at least one gradient pulse in its original length may be too great.

In one embodiment, a difference between the gradient moment of the at least one gradient pulse of the optimized pulse sequence and the gradient moment of a gradient pulse of the preliminary pulse sequence is minimized. The gradient moment M may be the amplitude-time integral of the gradient pulse: $M = \int_{t_i}^{t_f} G(t) dt$. In this case, $t_i$ is the start time, $t_f$ is the finish time, and $G(t)$ is the time-dependent amplitude of the gradient pulse. Retaining the gradient moment is of advantage for phase encoding gradients, since in this way, an effective phase encoding in the k-space remains unchanged.

With a shortening of the at least one gradient pulse, with a corresponding increase of the rise time and/or with an increase of the amplitude of the at least one gradient pulse, the gradient moment may be retained, since the amplitude-time integral thus remains constant. This enables it to be prevented that timing (e.g., the repeat time TR and/or the echo time TE and/or the echo spacing) is to be changed.

In a development of the method, the search for a time interval I is embodied so that at least one time interval I is sought in which the shape of the at least one gradient pulse is able to be changed such that the associated gradient moment remains the same. In this search, time ranges in which the gradient pulses of the preliminary pulse sequence are not to be changed, such as readout or excitation intervals, are excluded.

With a shortening of a gradient pulse while retaining a gradient moment, a amplitude generally increases (e.g., also time and/or decay time). A higher amplitude of the gradient pulse may be accompanied by a higher current and/or a higher voltage and/or a higher power, with which the at least one gradient coil is to be supplied. Therefore, in accordance with an aspect of the method, the distribution of the current and/or of the voltage and/or of the power of the at least one gradient amplifier to the at least one gradient coil is optimized.

For example, two gradient amplifiers may have a different maximum power and/or a different maximum voltage and/or a different maximum current strength. If now, for example, the gradient amplifier with the smaller maximum power and/or maximum voltage and/or maximum current strength may not deliver the power and/or voltage and/or current strength to generate a gradient pulse with a desired shortened duration but correspondingly higher amplitude for maintaining the gradient moment, the gradient amplifier with the greater maximum power and/or maximum voltage and/or maximum current strength may possibly do this.

Through a suitable use of the switching matrix, a corresponding distribution may be carried out.

In one embodiment, the gradient pulses that have a below-average amplitude are shortened, since the amplitudes, for a given maximum power and/or maximum voltage and/or maximum current strength of the at least one gradient amplifier, may be especially greatly increased. This enables the pulse durations to be especially greatly shortened while retaining the associated gradient moment. For example, in this way, gradient pulses, which in accordance with the preliminary pulse sequence, are at least partly arranged contemporaneously, may be arranged in an optimized pulse sequence with higher amplitude, but shortened and shifted in time.

A duration of at least one excitation pulse and/or a readout process is optimized (e.g., shortened). This enables time intervals to be created or increased that may serve to accommodate gradient pulses as part of the optimization of the preliminary pulse sequence. A shortening of the excitation pulse may be achieved by a higher excitation bandwidth and a shortening of the readout process using a higher readout bandwidth.

One form of embodiment makes provision for an echo time TE and/or a repeat time TR and/or an echo spacing to be optimized (e.g., lengthened). The echo time may be the time between the excitation pulse and an echo that occurs, which serves as magnetic resonance signals. The repeat time TR (e.g., repetition time) may be the time between two consecutive excitation pulses. The echo spacing may be the amount of time between two echoes in multi-echo sequences, such as TSE or EFI sequences, for example.

Because of given general conditions, such as, for example, the maximum power and/or maximum voltage and/or maximum current strength of the at least one gradient amplifier, in order to optimize the preliminary pulse sequence such that, at each point in time of the pulse sequence, a sufficient number of gradient amplifiers is available for the operation of the gradient coils used, an adaptation of the echo time TE and/or of a repeat time TR is to be provided. Thus, for example, a lengthening of the echo time TE and/or of a repeat time TR may lead to one or more time intervals being created or increased, which may serve to accommodate gradient pulses as part of the optimization of the preliminary pulse sequence.

A computer program product that includes a program and is able to be loaded directly into a memory of a programmable system control unit is provided. Code and/or instructions of the program for executing a method when the program is executed in the system control unit of the magnetic resonance device is provided.

DETAILED DESCRIPTION

DETAILED DESCRIPTION

Figure 1:
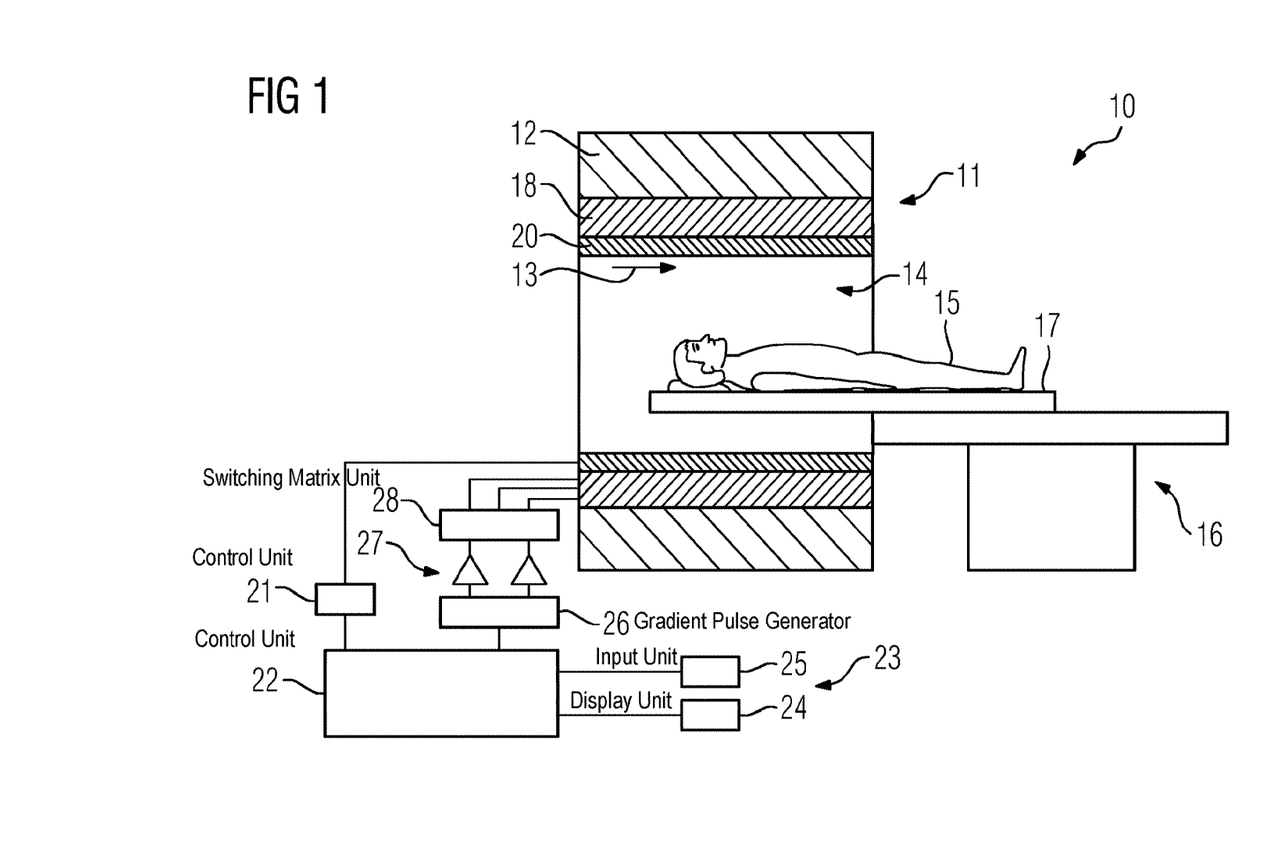
FIG. 1 shows a basic diagram of one embodiment of a magnetic resonance device.

A magnetic resonance device 10 is shown schematically in FIG. 1. The magnetic resonance device 10 includes a magnetic unit 11. The magnetic unit 11 includes a superconducting main magnet 12 for creating a strong and, for example, temporally constant main magnetic field 13. In addition, the magnetic resonance device 10 has a patient receiving area 14 for receiving a patient 15. The patient receiving area 14 in the present exemplary embodiment is cylindrical in shape and is surrounded in a circumferential direction by the magnet unit 11 in a cylindrical form. An embodiment of the patient receiving area 14 deviating therefrom, however, may be provided. The patient 15 may be pushed by a patient support device 16 of the magnetic resonance device 10 into the patient receiving area 14. The patient support device 16 includes a patient table 17 embodied movably within the patient receiving area 14.

The magnet unit 11 also includes gradient coils 18 for creating magnet field gradients that are used for local encoding during imaging. The magnet unit 11 further includes a radio-frequency antenna unit 20 that may be embodied as a body coil permanently integrated into the magnetic resonance device 10. The radio-frequency antenna unit 20 is configured for excitation of atomic nuclei, which occurs in the main magnetic field 13 created by the main magnet 12. The radio-frequency antenna unit 20 is controlled by a radio-frequency antenna control unit 21 of the magnetic resonance device 10 and radiates radio-frequency magnetic resonance sequences into an examination space, which is essentially formed by a patient receiving area 14 of the magnetic resonance device 10. The radio-frequency antenna unit 20 is also embodied for receiving magnetic resonance signals.

For controlling the main magnet 12 and radio-frequency antenna control unit 21, the magnetic resonance device 10 includes a system control unit 22. The system control unit 22 also controls a gradient pulse generator 26, of which the signals are amplified by gradient amplifiers 27 and are forwarded to a switching matrix unit 28. In addition, the system control unit 22 controls the switching matrix unit 28. In FIG. 1, for reasons of clarity, no connecting line is shown between the system control unit 22 and the switching matrix unit 28. The switching matrix unit 28 connects the two gradient amplifiers 27 in this example with the three gradient coils 18. The number of gradient amplifiers 27 and gradient coils 18 may vary. Advantageously, as in the example shown in FIG. 1, the number of gradient amplifiers is smaller than the number of gradient coils (e.g., only one gradient amplifier for three gradient coils) in order to reduce the costs arising from the gradient amplifiers. For example, the number of gradient amplifiers, as in the example shown in FIG. 1, may be smaller than three, and/or the number of gradient coils may also be greater than three.

The system control unit 22 centrally controls the magnetic resonance device 10, such as, for example, the carrying out of a predetermined imaging pulse sequence. In addition, the system control unit 22 includes an evaluation unit not shown in any greater detail for evaluation of medical imaging data, which is detected during the magnetic resonance examination, as well as a memory unit and a processor unit for carrying out an embodiment of a method. For example, a computer program including instructions may be stored on a non-transitory computer-readable medium and may be executed by software stored in the memory unit.

The magnetic resonance device 10 includes a user interface 23 that is connected to the system control unit 22. Control information, such as imaging parameters, as well as reconstructed magnetic resonance images, may be shown on a display unit 24 (e.g., on at least one monitor) of the user interface 23 for a medical operator. The user interface 23 has an input unit 25, by which the information and/or parameters may be entered during a measurement process by the medical operating personnel.

The magnetic resonance device 10 shown in the present exemplary embodiment may include further components that magnetic resonance devices normally feature. A general way in which a magnetic resonance device 10 functions is also known to the person skilled in the art, so that a more detailed description of the general components will not be provided here.

Figure 2:
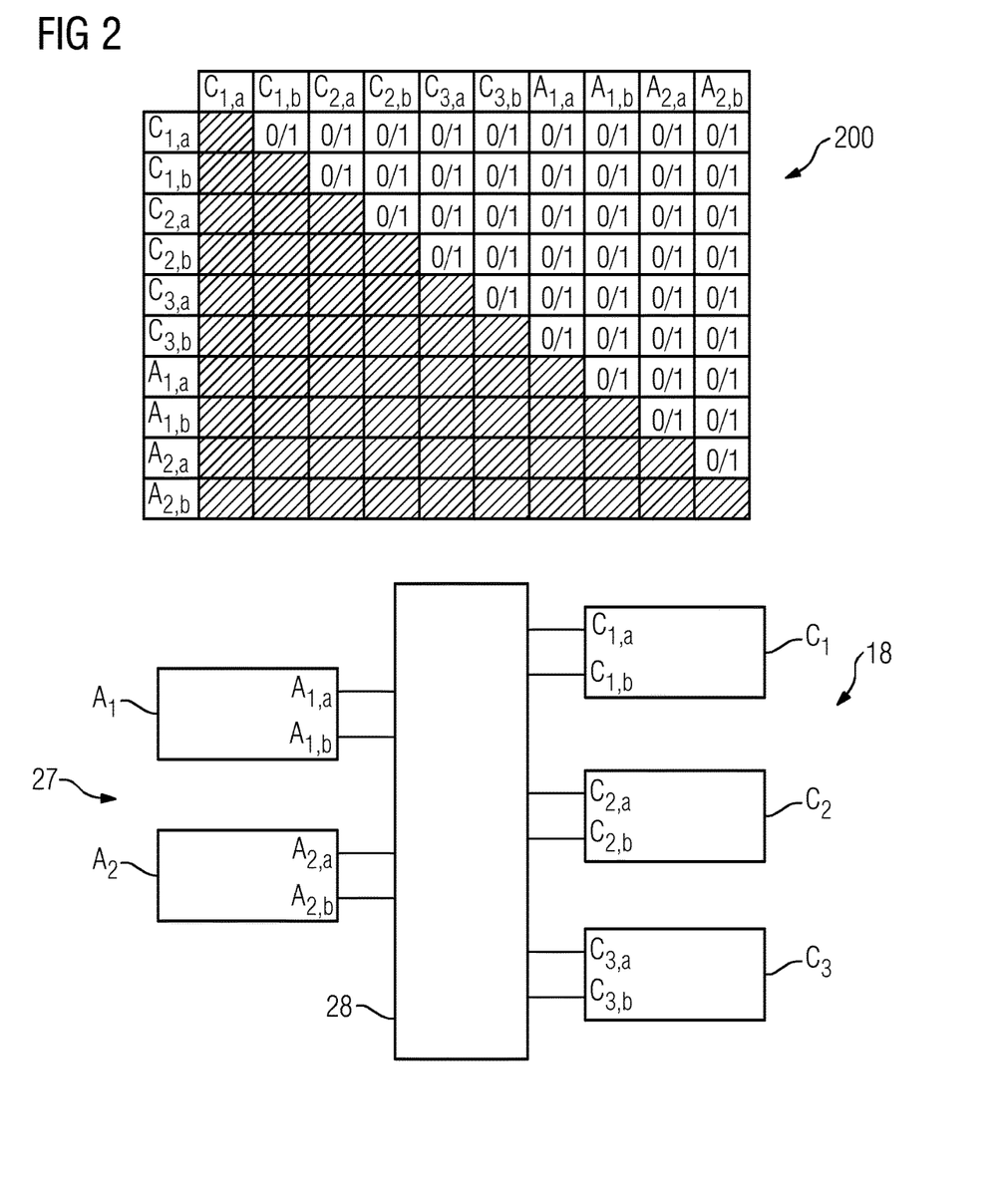
FIG. 2 shows a block diagram of a system that includes two gradient amplifiers and three gradient coils, with an associated connection state matrix.

As in FIG. 1, the example shown in FIG. 2 includes two gradient amplifiers 27, designated $A_1$ and $A_2$, as well as three gradient coils 18, which are designated $C_1$, $C_2$ and $C_3$. Each of the gradient amplifiers 27 and each of the gradient coils 18 has two terminals (e.g., $A_{1,a}$ and $A_{1,b}$ for the gradient amplifier $A_1$ etc.). This corresponds to a usual embodiment, in accordance with which gradient amplifier 27 and gradient coil 18 each have at least one electrical input and one electrical output. The switching matrix unit 28 is embodied to change at least one switching state of the terminals $A_{1,a}$, $A_{1,b}$, $A_{2,a}$ and $A_{2,b}$ of the gradient amplifier $A_1$ and $A_2$ and the terminals $C_{1,a}$, $C_{1,b}$, $C_{2,a}$, $C_{2,b}$, and $C_{3,a}$, $C_{3,b}$ of the gradient coils. The entries 0/1 of the matrix 200 indicate possible switching states of the switching matrix 28 (e.g., 1 corresponds to the possible switching state "connected" and 0 corresponds to the possible switching state "not connected"). In this example, the switching matrix unit 28 is in a position to establish all conceivable connection states, since all matrix elements of the matrix 200 above main diagonals may either be 0 or 1. Other embodiments of the switching matrix unit 28, however, that have only restricted switching facilities, so that not every terminal may be connected to any other terminal, may be provided.

The matrix elements on the main diagonals and below are not available since the matrix elements on the main diagonals would correspond to senseless connections of the terminals to themselves and the matrix elements below the main diagonals are redundant in relation to the matrix elements above the main diagonals.

Figure 3:
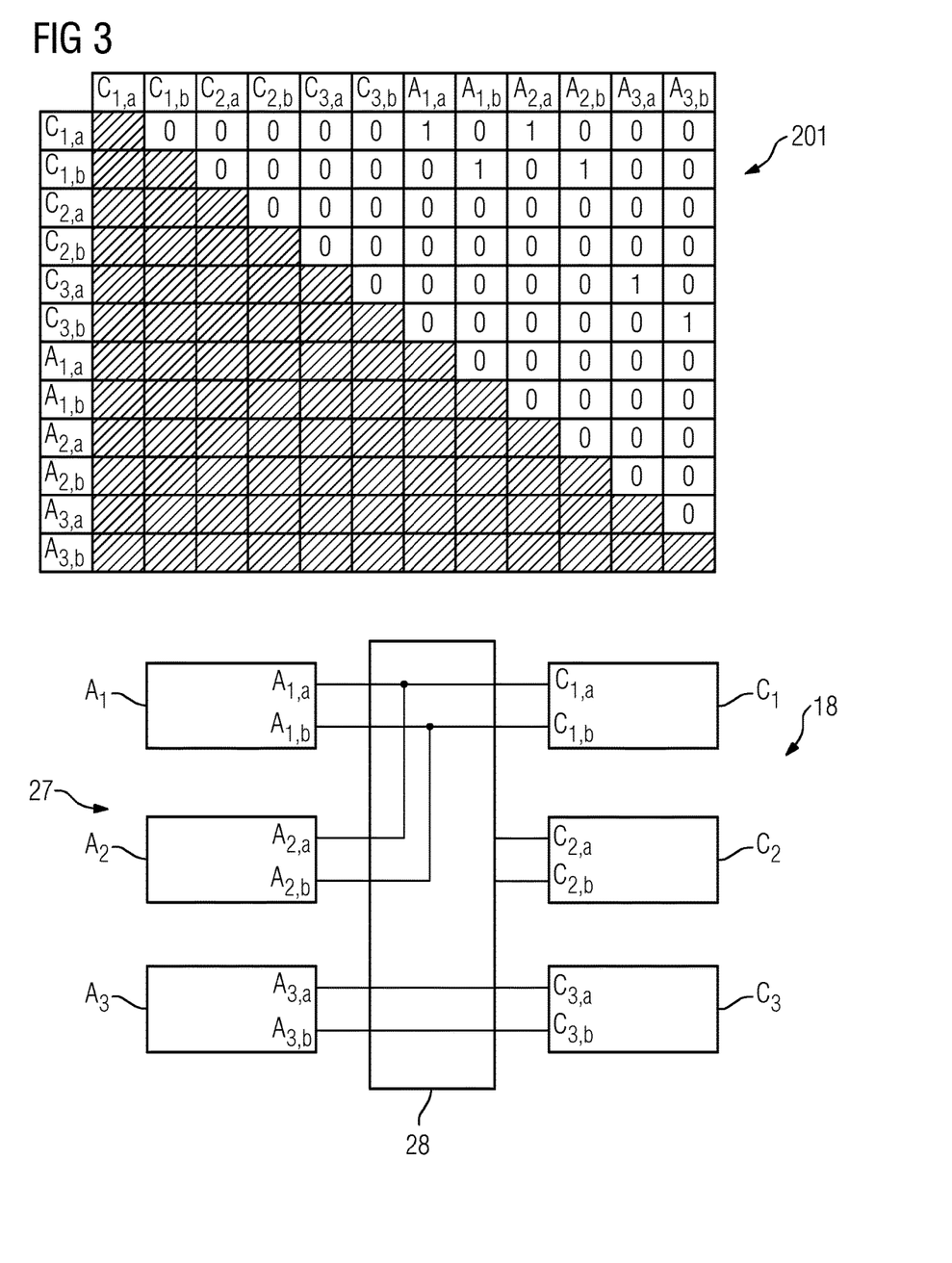
FIG. 3 shows a block diagram of a system that includes two parallel-connected gradient amplifiers, with an associated connection state matrix.
Figure 4:
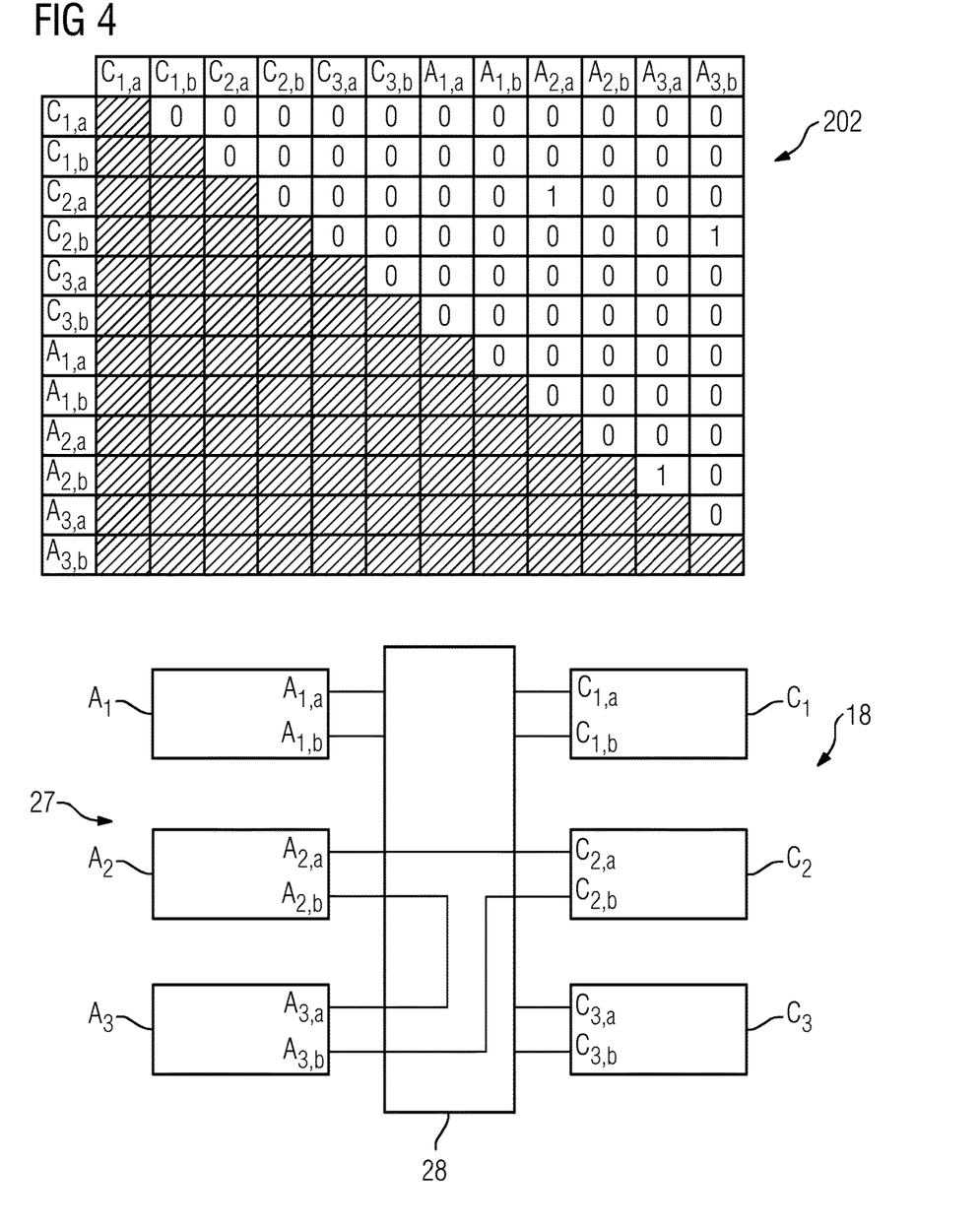
FIG. 4 shows a block diagram of a system that includes two series-connected amplifiers, with an associated connection state matrix.

FIGS. 3 and 4 each show an example with three gradient amplifiers $A_1$, $A_2$ and $A_3$ and also three gradient coils $C_1$, $C_2$ and $C_3$, the terminals of which $A_{1,a}$, $A_{1,b}$, $A_{2,a}$, $A_{2,b}$, $A_{3,a}$ and $A_{3,b}$ and also $C_{1,a}$, $C_{1,b}$, $C_{2,a}$, $C_{2,b}$ and $C_{3,a}$, $C_{3,b}$ are able to be connected differently to one another by the switching matrix 28.

In FIG. 3, the gradient amplifiers $A_1$ and $A_2$ are connected to the gradient coil $C_1$ by a parallel circuit. Through the parallel circuit, a current strength $I_1$ of the gradient amplifier $A_1$ is added to a current strength $I_2$ of the gradient amplifier $A_2$ to form an overall current strength $I_{1,2}=I_1+I_2$. The power is also added up accordingly. This addition of current and/or addition of power made possible by the switching matrix unit 28 is advantageous when the maximum current strength and/or power of an individual gradient amplifier would not be sufficient to supply a gradient coil with a desired current strength and/or power. Thus, lower-cost gradient amplifiers with lower maximum current strength and/or power compared to conventional embodiments, for example, may be used. In addition, in FIG. 3, the gradient amplifier $A_3$ is connected to the gradient coil $C_3$. The matrix 201 maps the connection states shown below through matrix element entries.

In FIG. 4, the gradient amplifiers $A_2$ and $A_3$ are connected to the gradient coil $C_2$ by a series circuit. Through the series circuit, a voltage $U_2$ of the gradient amplifier $A_2$ is added to a voltage $U_3$ of the gradient amplifier $A_3$ to form an overall voltage $U_{2,3}=U_2+U_3$. The power is also added up accordingly. This addition of voltage and/or addition of power made possible by the switching matrix unit 28 is advantageous when the maximum voltage and/or power of an individual gradient amplifier would not be sufficient to supply a gradient coil with a desired voltage and/or power. Thus, lower-cost gradient amplifiers with lower maximum voltage and/or power compared to conventional embodiments, for example, may be used. The matrix 202 maps the connection states shown below through matrix element entries. Through the switching matrix unit 28, not only may one or more gradient amplifiers be connected in series, but also one or more gradient coils.

Through the flexibility in the setting of possible connection states, which are illustrated by way of example in FIGS. 3 and 4, at least two gradient amplifiers may also sensibly have at least one different characteristic (e.g., a different maximum power and/or a different maximum voltage and/or a different maximum current strength). The magnetic resonance device 10 with the switching matrix unit 28 of one or more of the present embodiments may not only be of advantage when the number of gradient amplifiers is smaller than the number of gradient coils, but also when the number of gradient amplifiers is less than or equal or greater than the number of gradient coils.

Figure 5:
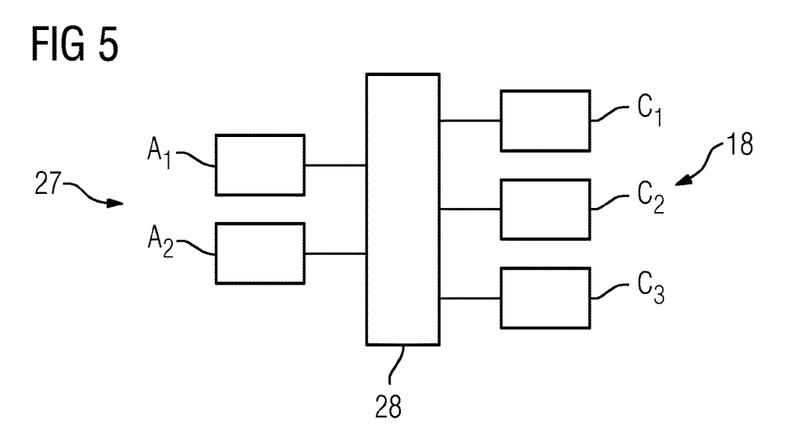
FIG. 5 shows a simplified block diagram of a system that includes two gradient amplifiers and three gradient coils.
Figure 6:
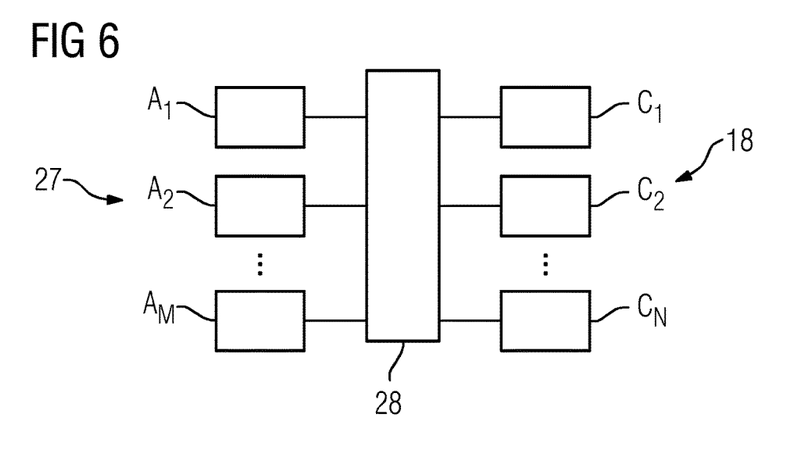
FIG. 6 shows a simplified block diagram of a system that includes M gradient amplifiers and N gradient coils.

FIGS. 5 and 6 show exemplary embodiments in a simplified form. In this case, FIG. 5 corresponds to the example already shown in FIG. 2. The example in FIG. 6 includes M gradient amplifiers and N gradient coils. M may be less than N in order to save on gradient amplifiers. As shown in FIGS. 3 and 4, advantageous forms of embodiments with M=N or M>N may also be provided.

FIGS. 7 to 10 show exemplary possibilities of how a switching matrix unit 28 may be implemented for two gradient amplifiers $A_1$ and $A_2$ and three gradient coils $C_1$, $C_2$ and $C_3$. In these examples, SP2T (single pole, two throw) switches and/or SP3T (single pole, three throw) switches are used. The gradient amplifiers $A_1$ and $A_2$ in these case may have the same current, voltage and power characteristics or different.

Figure 7:
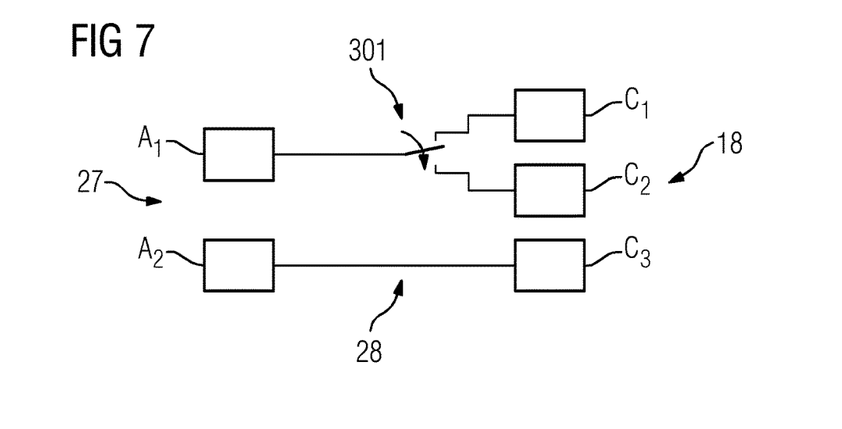
FIG. 7 shows a block diagram of a circuit that includes an SP2T switch.

In FIG. 7, the switching matrix unit 28 includes one SP2T switch 301 that may electrically connect the gradient amplifier $A_1$ to one of the two gradient coils $C_1$ and $C_2$. In addition, the gradient amplifier $A_2$ is connected to the gradient coil $C_3$.

Figure 8:
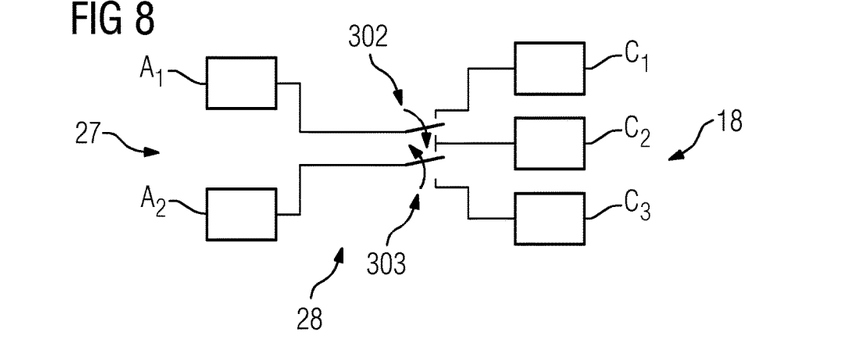
FIG. 8 shows a block diagram of a circuit that includes two SP2T switches.

In FIG. 8, the switching matrix unit 28 includes two SP2T switches 302 and 303. The SP2T switch 302 may connect the gradient amplifier $A_1$ to one of the two gradient coils $C_1$ and $C_2$, and the SP2T switch 303 may connect the gradient amplifier $A_2$ to one of the gradient coils $C_2$ or $C_3$. This enables the gradient coil $C_2$ to be connected not only to one of the two gradient amplifiers $A_1$ or $A_2$ at one point in time, but also to be connected at the same time to both gradient amplifiers $A_1$ and $A_2$, which would correspond to a parallel circuit of the gradient amplifiers.

Figure 9:
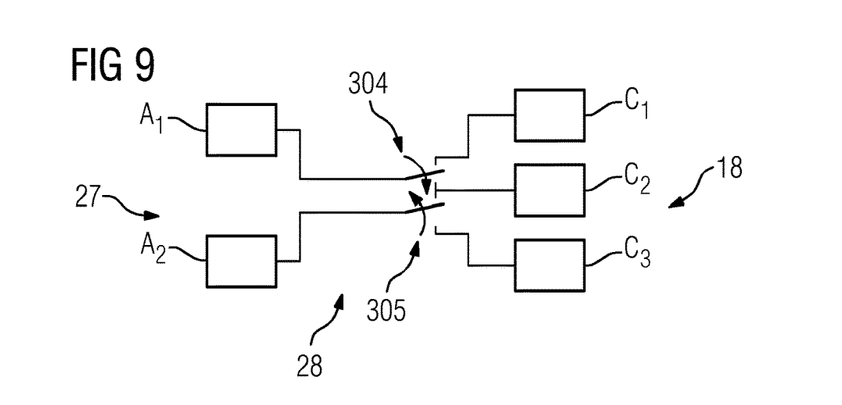
FIG. 9 shows a block diagram of a circuit that includes an SP2T switch and an SP3T switch.

In FIG. 9, the switching matrix unit 28 includes one SP3T switch 304 that may connect the gradient amplifier to one of the gradient coils $C_1$ or $C_2$ or $C_3$, and one SP2T switch 305 that may connect the gradient amplifier to one of the gradient coils $C_2$ or $C_3$. This enables the gradient coils $C_2$ or $C_3$ to be connected at the same time to the gradient amplifiers $A_1$ and $A_2$, for example.

Figure 10:
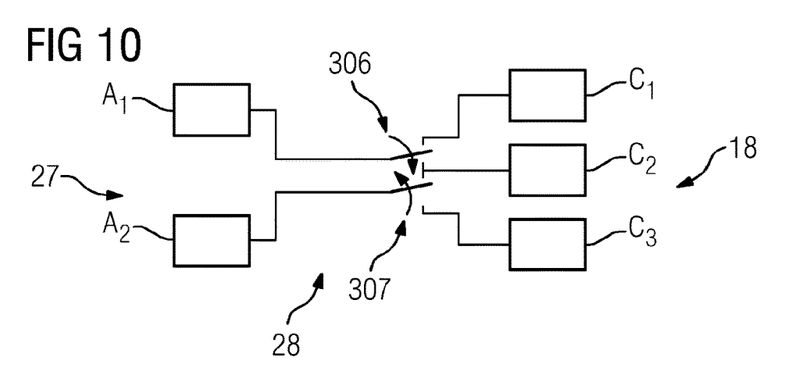
FIG. 10 shows a block diagram of a circuit that includes two SP3T switches.

In FIG. 10, the switching matrix 28 has two SP3T switches 306 and 307. The SP3T switch 306 may connect the gradient amplifier $A_1$ to one of the gradient coils $C_1$ or $C_2$ or $C_3$, and the SPT2 switch 307 may connect the gradient amplifier $A_2$ to one of the gradient coils $C_1$ or $C_2$ or $C_3$. This enables each gradient coil to be connected simultaneously to the gradient amplifiers $A_1$ and $A_2$, for example.

Figure 11:
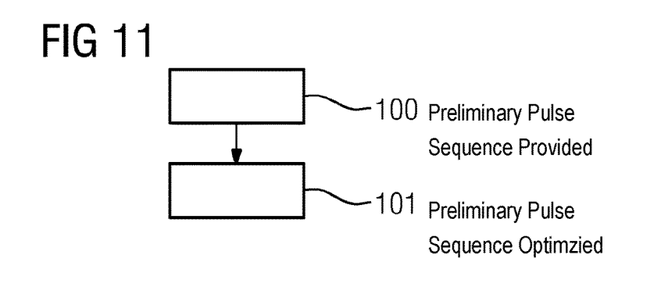
FIG. 11 shows a flow diagram of one embodiment of a method.

In FIG. 11, a form of embodiment of a method for optimizing a preliminary pulse sequence for the magnetic resonance device is illustrated. In act 100, a preliminary pulse sequence is provided, which is optimized in act 101 such that at each point of the pulse sequence, a sufficient number of gradient amplifiers 26 are available for the operation of the gradient coils 18 used. To carry out the method, the system control unit 22 has computer programs and/or software that carry out the method of one or more of the present embodiments when executed by a processor unit of the system control unit 22. The computer programs and/or software are stored in a memory unit of the data evaluation unit 22, which is not shown in any greater detail.

One or more embodiments of the method support operation of a gradient system with a reduced number of gradient amplifiers 27 and/or flexible activation. This provides that, inter alia, less complex and thus low-cost gradient amplifiers 27 are used and/or flexible solutions for research systems with, for example, non-linear gradient fields are made possible.

Figure 12:
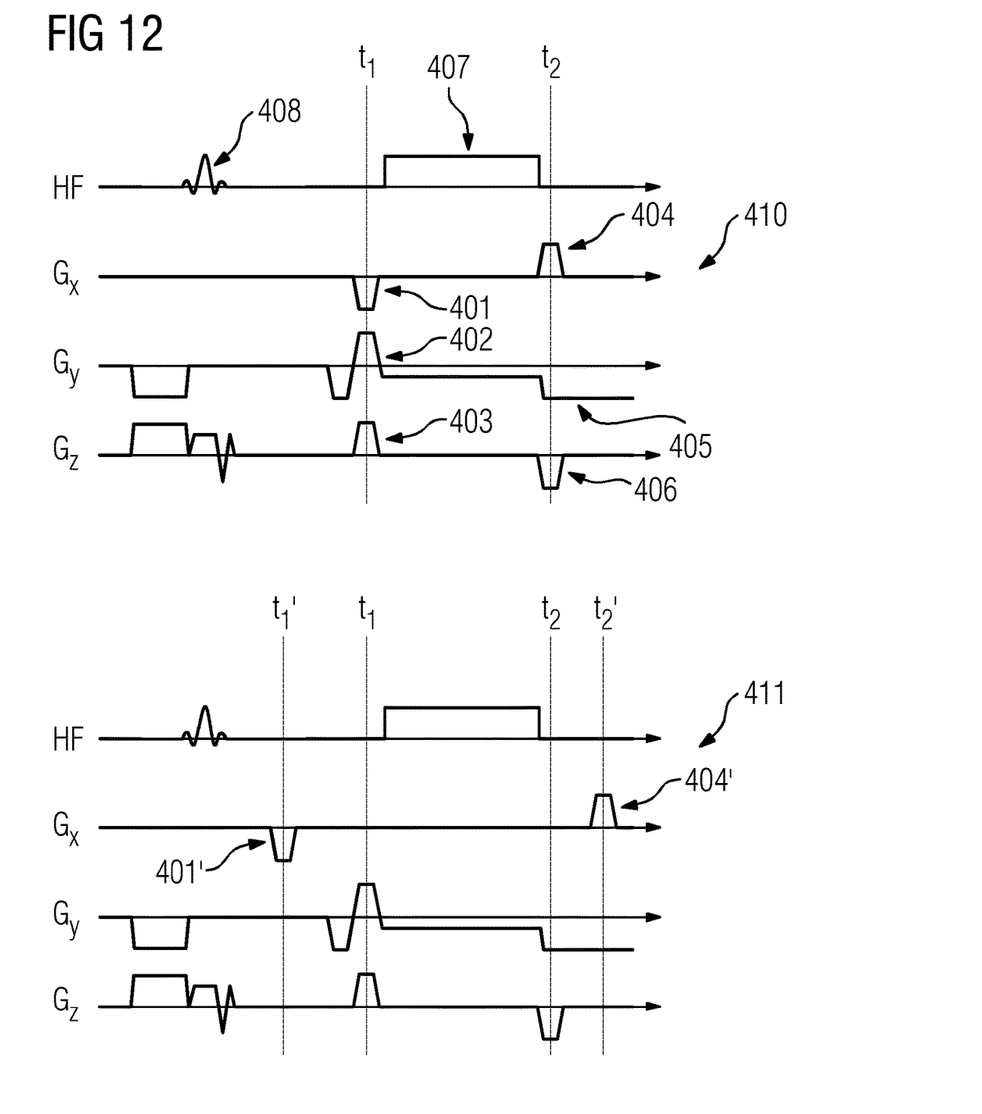
FIG. 12 shows a sequence diagram of a gradient-echo-based TOF sequence.

FIG. 12 shows at the top an exemplary sequence diagram 410 of a preliminary gradient-echo-based time-of-flight sequence (TOF sequence) and at the bottom shows a sequence diagram 411 of the same pulse sequence after an optimization. Each sequence diagram includes four axes. In each of these diagrams, the upper axis illustrates RF processes that are carried out by the radio-frequency antenna unit 20, such as, for example, the sending out of an excitation pulse 408. The three lower axes $G_x$, $G_y$ and $G_z$ in each case reflect processes that are carried out by a gradient coil in each case. Thus, in accordance with the diagram, the preliminary sequence 410 is to be switched before and after a readout process 407 on all three gradient axes $G_x$, $G_y$ and $G_z$: 401, 402 and 403 at time $t_1$ and also 404, 405 and 406 at time $t_2$. Assuming that there are only two gradient amplifiers 27 available, this would normally not be able to be carried out in accordance with the preliminary pulse sequence. Through the method of one or more of the present embodiments, the gradient pulses 401 and 404 of the preliminary pulse sequence serving for phase encoding are shifted in time on axis $G_x$: The gradient pulse 401' results from a shifting of $t_1$ to $t_1$' and the gradient pulse 404' results from a shifting of $t_2$ to $t_2$'. Thus, in the optimized pulse sequence, at no point of the sequence section shown in sequence diagram 411 are more than two gradient coils 18 activated at the same time. This is possible in this case without any change in the timing and/or the contrast and/or the effective k-space encoding.

Figure 13:
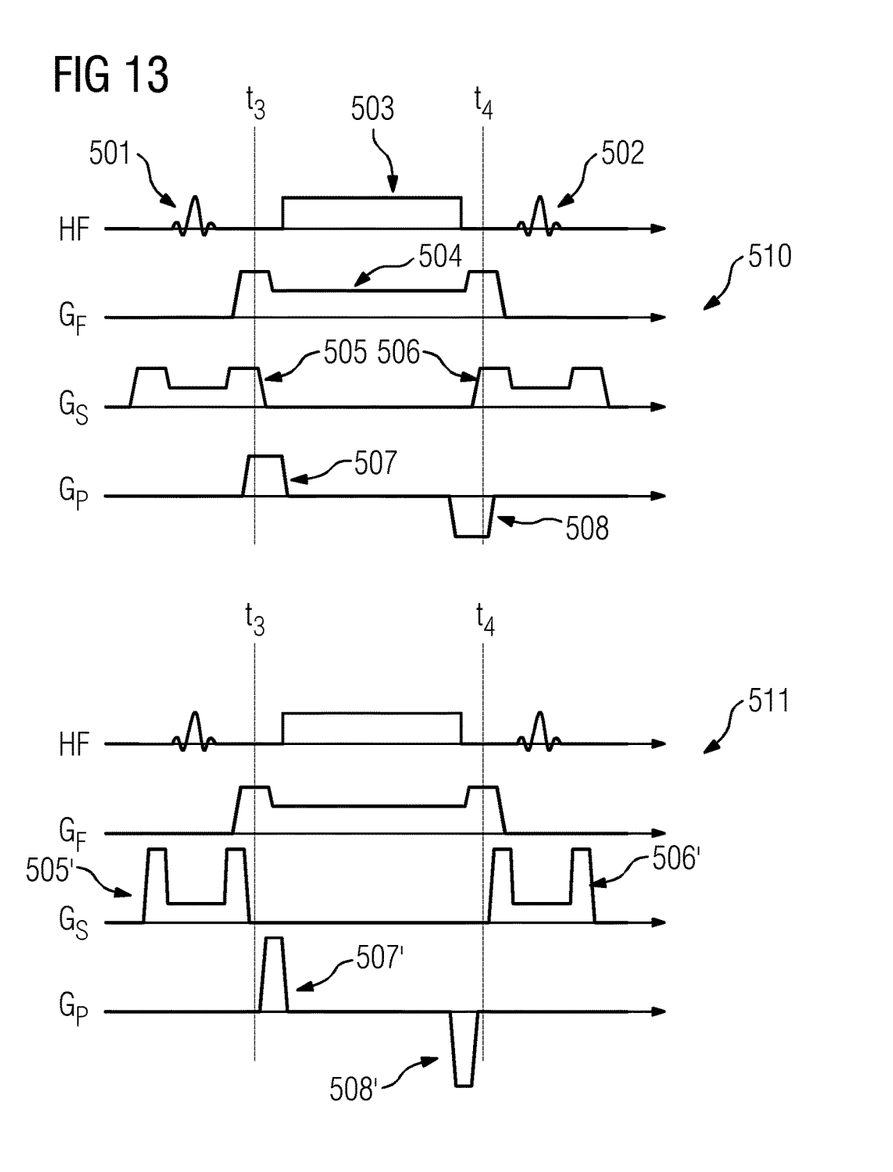
FIG. 13 shows a sequence diagram of a TSE sequence.

FIG. 13 shows at the top a sequence diagram 510 of a preliminary turbo spin echo sequence (TSE sequence) and at the bottom a sequence diagram 511 of the same pulse sequence after an optimization. In this figure, the top axis again illustrates RF processes in each case, which are carried out by the radio-frequency antenna unit, such as, for example, the ending out of 180° pulses 501 and 502. The three lower axes $G_F$, $G_S$ and $G_P$ in each case reflect processes that are each carried out by a gradient coil. The gradient pulses 505 and 506 on the axis $G_S$ serve to encode a slice, while the gradient pulses 507 and 508 on the axis $G_P$ encode a phase. At the same time, at time $t_3$, three gradient pulses 504, 505 and 507, and at a time $t_4$, 504, 506 and 508 are to be carried out. Under the condition that only two gradient amplifiers 27 are available, this is normally not possible. In this case, by contrast with the example illustrated in FIG. 12, it is not possible, by shifting one or more gradient pulses in time, to create a pulse sequence in which at any point a sufficient number of gradient amplifiers would be available for operation of the gradient coils used.

There may be an optimization of the pulse sequence, for example, by the shapes of the gradient pulses 505 and 507 as well as 506 and 508 being adapted, by the duration of the optimized gradient pulses 505', 506', 507', 508' being shortened. This optimization is performed such that the gradient moments remain constant as in the example shown (e.g., the corresponding surface integrals remain the same). Thus, for example, the surface below the gradient pulse 507 is identical to the surface below the gradient pulse 507', etc. Higher amplitudes and possibly higher rise and/or decay rates are needed for this.

However, other preliminary pulse sequences in which neither a shift, as in the example of FIG. 12, nor a gradient moment-obtaining shortening of at least one gradient pulse leads to the goal may be provided. An echo time TE and/or a repeat time TR and/or an echo spacing may be optimized in these cases. If, for example, in the pulse sequence shown by the sequence diagram, no shortening of the gradient pulses were possible (e.g., because the gradient amplifiers 27 are not designed for the higher amplitudes and/or rise and/or decay rates necessary for this), the echo spacing may be lengthened, for example, to create periods in which a shifting of the at least one gradient pulse takes place. Other sequence settings are also changed, such as, for example, an increase in a readout and pulse bandwidth, through which one or more excitation pulses and/or one or more readout processes may be optimized, so that the timing may not be changed.

The invention is described here in relation to embodiments. The invention is not restricted to the concrete embodiment of the exemplary embodiments shown. The person skilled in the art may derive variations based on the description without deviating from the essential basic ideas of the invention.

One or more of the present embodiments relate to a magnetic resonance device with at least one gradient amplifier and at least one gradient coil. The magnetic resonance device includes a switching matrix unit that is embodied flexibly to connect the at least one gradient amplifier to the at least one gradient coil. A method for optimizing a preliminary pulse sequence for the magnetic resonance device, which makes sure that in the optimized pulse sequence, a sufficient number of gradient amplifiers is available at any point for operating the gradient coils used, as well as a computer program product for carrying out the method, are provided.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance device with at least one gradient amplifier and at least one gradient coil operable to generate a gradient field during a pulse sequence, each of the at least one gradient amplifier and the at least one gradient coil having at least one terminal, the magnetic resonance device comprising:
a switching matrix unit configured to change at least one connection state of the at least one terminal of the at least one gradient amplifier and of the at least one terminal of the at least one gradient coil,
wherein the number of gradient amplifiers is smaller than the number of gradient coils.

2. The magnetic resonance device of claim 1, wherein the number of gradient amplifiers is smaller than three, the number of gradient coils is larger than three, or a combination thereof.

3. The magnetic resonance device of claim 1, wherein the number of gradient amplifiers is one and the number of gradient coils is three.

4. The magnetic resonance device of claim 1, wherein the at least one gradient amplifier comprises more than one gradient amplifier, and
wherein at least two of the gradient amplifiers have at least one different characteristic.

5. The magnetic resonance device of claim 4, wherein the at least one different characteristic is a different maximum power, a different maximum voltage, a different maximum current strength, or any combination thereof.

6. The magnetic resonance device of claim 1, wherein the at least one gradient coil is configured to create a spatially non-linear gradient field.

7. A method for optimizing a preliminary pulse sequence for a magnetic resonance device, the magnetic resonance device comprising at least one gradient amplifier at least one gradient coil operable to generate a gradient field during a pulse sequence, each of the at least one gradient amplifier and the at least one gradient coil comprising at least one terminal, the magnetic resonance device further comprising a switching matrix unit configured to change at least one connection state of the at least one terminal of the at least one gradient amplifier and of the at least one terminal of the at least one gradient coil, the method comprising:
optimizing a pulse sequence so that, at any point of the pulse sequence, a sufficient number of gradient amplifiers is available for operation of the at least one gradient coil,
wherein the number of gradient amplifiers is smaller than the number of gradient coils.

8. The method of claim 7, further comprising minimizing a difference between a k-space encoding of the optimized pulse sequence and a k-space encoding of the preliminary pulse sequence.

9. The method of claim 7, wherein the optimizing comprises minimizing a difference between at least one contrast of the optimized pulse sequence and at least one contrast of the preliminary pulse sequence.

10. The method of claim 7, wherein the optimizing comprises minimizing a duration of the pulse sequence.

11. The method of claim 7, wherein at least one gradient pulse of the preliminary pulse sequence is shifted in time within the preliminary pulse sequence.

12. The method of claim 7, wherein the optimizing comprises optimizing a duration of the at least one gradient pulse.

13. The method of claim 7, wherein a difference between a gradient moment of the at least one gradient pulse of the optimized pulse sequence and a gradient moment of the of the at least one gradient pulse of the preliminary pulse sequence is minimized.

14. The method of claim 7, further comprising optimizing a duration of at least one excitation pulse, at least one readout process, or a combination thereof.

15. The method of claim 7, further comprising optimizing an echo time, a repeat time, an echo spacing, or any combination thereof.

16. In a non-transitory computer-readable media having instructions executable by a controller to optimize a preliminary pulse sequence for a magnetic resonance device, the magnetic resonance device comprising at least one gradient amplifier at least one gradient coil operable to generate a gradient field during a pulse sequence, each of the at least one gradient amplifier and the at least one gradient coil comprising at least one terminal, the magnetic resonance device further comprising a switching matrix unit configured to change at least one connection state of the at least one terminal of the at least one gradient amplifier and of the at least one terminal of the at least one gradient coil, the instructions comprising:
optimizing a pulse sequence so that, at any point of the pulse sequence, a sufficient number of gradient amplifiers is available for operation of the at least one gradient coil,
wherein the number of gradient amplifiers is smaller than the number of gradient coils.

* * * * *